United States Patent

[11] 3,596,138

[72] Inventor Sanford S. Lehrfeld
Heightstown, N.J.
[21] Appl. No. 852,752
[22] Filed Aug. 25, 1969
[45] Patented July 27, 1971
[73] Assignee Tek-Wave, Inc.
Princeton, N.J.

[54] INTERBOARD FEED-THRU FOR JOINING PRINTED AND INTEGRATED CIRCUITS
10 Claims, 8 Drawing Figs.

[52] U.S. Cl. 317/101, 333/84, 333/33
[51] Int. Cl. H05k 1/04
[50] Field of Search 333/84 M, 97, 33, 98 M; 317/101 CL, 101 CM, 101

[56] References Cited

UNITED STATES PATENTS 2,794,174 5/1957 Arditi et al. 333/84 M (UX)
2,814,781 11/1957 Zaleski 333/33 X
2,978,657 4/1961 Marcuse 333/98 M (UX)
3,201,722 8/1965 May et al. 333/84 M (UX)

*Primary Examiner*—David Smith, Jr.
*Attorney*—Ostrolenk, Faber, Gerb and Soffen

ABSTRACT: A feed-thru device making it possible to stack integrated circuits and/or printed circuit boards in closely spaced parallel fashion and providing means for joining components and/or terminals from one adjacent board to the next. The feed-thru is comprised of a solid conductive body for threadedly engaging suitable mounting hardware to rigidly join adjacent boards in closely spaced parallel fashion. The conductive body further acts as part of a coaxial circuit in conjunction with a center conductor electrically isolated from he conductive body by a suitable insulating sleeve, which center conductor further functions as a pin or terminal for connection with the printed circuit terminal element at both ends of the center conductor or pin. The configuration of the pin provides excellent impedance matching between each printed circuit through the coaxial configuration. The mounting hardware is so arranged as to provide excellent mode suppression at microwave frequencies.

BEST AVAILABLE COPY

Figure 1A:
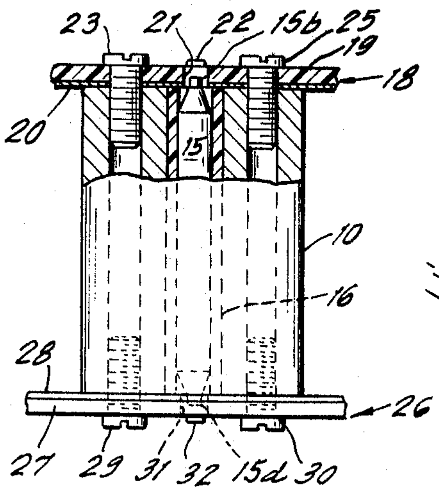

INVENTOR.
SANFORD S. LEHRFELD

BY

Ostrolenk, Faber, Gerb & Soffen

ATTORNEYS

INTERBOARD FEED-THRU FOR JOINING PRINTED AND INTEGRATED CIRCUITS

The present invention relates to electronic circuitry and more particularly to a novel feed-thru assembly for mechanically and electrically connecting adjacent printed circuit boards in closely spaced parallel fashion.

Printed circuits and integrated circuits find widespread use throughout the electrical and electronics industry. Such printed circuits are normally comprised of discrete components or elements mechanically joined to a planar insulating substrated and electrically interconnected by means of conductive coatings "printed" upon the insulating substrate. Integrated circuits are similar in nature wherein the discrete components or elements are printed or otherwise deposited upon an insulating substrate wherein said components may be comprised of one or more coatings deposited upon the substrate.

It is quite frequently necessary to electrically join integrated circuits provided on separate printed circuit boards to one another. The conventional technique usually employed is that in which edge connectors are provided, which edge connectors are releasably secured to one edge of such printed circuits and wherein the edge connectors of adjacent boards are electrically connected to one another by means of separate wires or composite wire cables comprised of a plurality of insulated wires.

The present invention is characterized by providing a novel interboard feed-through assembly which is capable of mechanically joining adjacent circuit boards in closely spaced parallel fashion and which feed-thru assemblies further serve the additional function of providing electrical connection between such adjacently aligned boards.

The present invention, is one preferred embodiment, is specifically designed for mechanically and electrically joining microwave integrated circuit boards. The feed-through assembly is comprised of a conductive body having suitable tapped openings for receiving mounting hardware so as to rigidly secure adjacent closely spaced parallel boards to the conductive body. The conductive body further serves as one element of a coaxial assembly which is further comprised of a central conductor or pin electrically isolated from and mounted along the longitudinal axis of the conductive body. The central conductor or mounting pin may be joined in any suitable fashion to printed leads or components provided upon the adjacent circuit boards.

In the case of microwave circuitry the extremely high operating frequencies make it extremely important to provide good impedance matching between the microwave circuits joined by means of the feed-through assembly (i.e. coaxial circuit). The tapered design of the connecting pin is such as to provide excellent impedance matching to efficiently maintain microwave transformation functions wherein a coaxial circuit is provided as the electrical interface between two microwave integrated circuits. The precise alignment of the mounting hardware provides a symmetrical pattern for the electrical circuit to provide excellent mode suppression. In one typical embodiment, feed-through of 50 ohm RF signals has been achieved with a minimum of discontinuity and with a considerable saving in the space occupied by the mechanically and electrically joined boards and the feed-through assemblies. Whereas the feed-through assembly is extremely effective for use in conjunction with microwave integrated circuitry it should be noted that the feed-through assemblies may also be employed in conjunction with equipment operating at much lower electrical frequencies.

It is therefore one primary object of the present invention to provide a novel feed-through assembly for electrically and mechanically joining adjacent circuit boards in closely spaced parallel fashion.

Another object of the present invention is to provide a novel interboard feed-through assembly for use in mechanically and electrically joining integrated circuit boards arranged in closely spaced parallel fashion wherein the mounting hardware of the feed-through assembly is arranged in such a fashion as to provide excellent mode suppression.

Still another object of the present invention is to provide a novel interboard feed-through assembly for use in mechanically and electrically connecting printed circuit boards in closely spaced parallel fashion wherein the feed-through assembly functions both as a mechanical joining means and as a coaxial type connecting means wherein the coaxial type assembly provides excellent impedance matching between the two printed circuit boards so joined.

These as well as other objects of the present invention will become apparent when reading the accompanying description and drawings in which:

FIG. 1*a* is an elevational view, partially sectionalized, showing the feed-through assembly of the present invention.

Figure 1B:
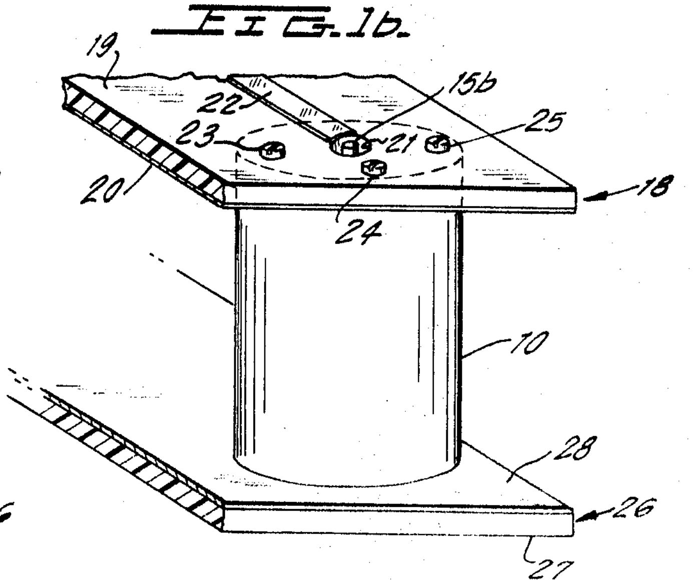

FIG. 1*b* is a perspective view of the feed-through assembly shown in FIG. 1*a*.

Figure 2B:
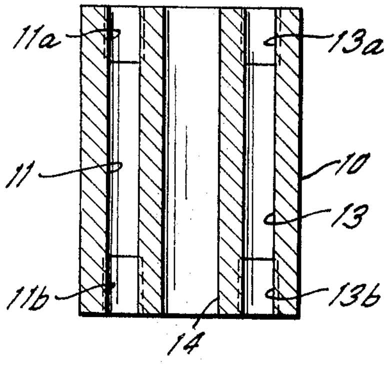
Figure 2A:
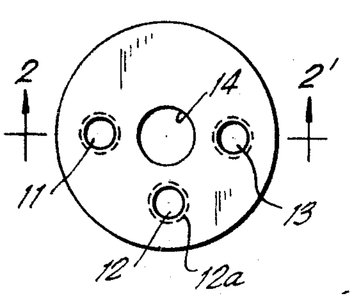

FIG. 2*a* is a top view of the conductive body forming part of the interboard feed-through assembly of FIGS. 1*a* and 1*b*.

FIG. 2*b* is a sectional view looking in the direction of arrows 2–2' shown in FIG. 2*a*.

Figure 3A:
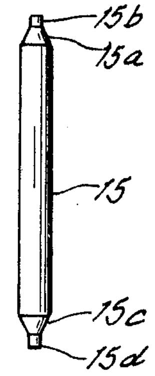
Figure 3B:
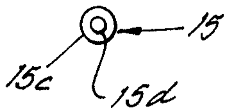

FIGS. 3*a* and 3*b* are side and end views respectively of the connecting pin assembly shown in FIGS. 1*a* and 1*b*.

Figure 4A:
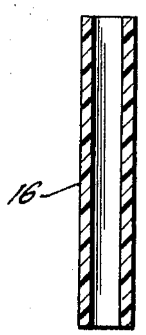
Figure 4B:

FIGS. 4*a* and 4*b* are sectional and end views respectively of the insulating sleeve employed in the interboard feed-through assembly of FIGS. 1*a* and 1*b*.

The interboard feed-through assembly is shown in fully assembled form in FIGS. 1*a* and 1*b* while FIGS. 2*a* through 4*b* show views of the components which comprise the assembly. Making reference to all of the figures, the interboard assembly is comprised of a cylindrical shaped conductive body 10 preferably formed of brass, but which may be formed of any other suitable conductive material. The conductive body 10 is provided with a plurality of openings 11 through 13 which openings have their longitudinal axes aligned along respective radii of the cylindrical body and arranged so that the openings are spaced at 90° intervals as can best be seen from a consideration of FIG. 2*a*. FIG. 2*b* shows a sectional view of conductive body 10 in which the elongated openings 11 and 13 are tapped at their upper and lower ends 11*a*—*11b* and 13*a*—*13b* respectively. It should be understood that opening 12 is tapped in a similar fashion wherein only the tapped portion 12*a* is shown in FIG. 2*a*.

Conductive body 10 is further provided with a centrally aligned opening 14 whose center lies along the longitudinal axis of the body 10.

A conductive pin 15 (note especially FIGS. 3*a*, 3*b* and 1*a*) is inserted into central opening 14 and is surrounded by a dielectric sleeve 16 (see FIGS. 4*a*, 4*b* and 1*a*) for electrically insulating pin 15 from conductive body 10 and thereby forming a coaxial type circuit. Pin 15 is provided with two tapered portions 15*a* and 15*c*, each of which terminate in a cylindrical portion 15*b* and 15*d* respectively, which cylindrical porti ns are of substantially smaller diameter than the main body of pin 15. The significance of the tapers will be described in greater detail hereinbelow. The inner diameter of sleeve 16 is preferably slightly smaller than the outer diameter of the main body of pin 15, so that pin 15 is force fitted within sleeve 16. In a similar fashion, the inner diameter of opening 14 in conductor body 10 is slightly less than the outer diameter of sleeve 16, so that both the pin 15 and sleeve 16 are force fitted within opening 14 in body 10.

FIGS. 1*a* and 1*b* show the manner in which the interboard feed-through assembly is mechanically and electrically joined between two spaced printed circuit members. As shown in these figures, an upper circuit board assembly 18 comprised of an insulating substrate 19 is further provided with a ground plane or conductive coating 20, which covers the entire underside of substrate 19. The board is machined or otherwise formed, so as to provide an opening 21, through which the smaller diameter cylindrical portion 15*b* protrudes. The upper surface of board assembly 18 may be provided with discrete components (such as, for example, both passive and active electrical elements) electrically connected to one another by means of conductive leads printed or otherwise formed upon the upper surface of board assembly 18. As one example, assembly 18 may comprise a microwave integrated circuit, designed to operate at RF frequencies. As shown best in FIG. 1*b*, board assembly 18 is provided with a conductive coating or lead 22, whose forward end (relative to FIG. 1*b*) lies immediately adjacent opening 21 for electrical connection to cylindrical portion 15*b* of conductive pin 15. The connection may preferably be made by soldering.

Although a ground plane or conductive coating 20 is deposited over the entire underside of board assembly 18, the diameter of opening 21 is sufficient so as to electrically isolate ground plane 20 from conductor pin 15.

Three holes are machined or otherwise formed in assembly 18, so as to receive the mounting hardware 23—25, each of which preferably consists of a threaded fastener for threadedly engaging the tapped openings 11—13 respectively, which openings are aligned with the suitable openings provided in board assembly 18. The mounting hardware firmly secures the board assembly 18 to conductor body 10, establishing an electrical path from ground plane 20 to conductor body 10.

A second board assembly 26, substantially similar in design to board assembly 18, is likewise provided with a ground plane or conductive coating 28 which is deposited or otherwise formed upon an insulating substrate 27. Assembly 26 is similarly provided with suitable openings for receiving mounting hardware 29 and 30, for joining board assembly 26 to conductor body 10. While three such suitable threaded fasteners are provided, only two are shown in FIG. 1*a*, for purposes of simplicity. An opening 31, which is machined or otherwise formed in board assembly 26, has its central axis lying along the central axis of pin 15. In a manner similar to that described above, the diameter of opening 31 is such as to electrically isolate ground plane 28 from pin portion 15*d*. However, ground plane 28 is electrically connected to conductor body 10 once the threaded fasteners 29 and 30 (as well as a third fastener, not shown) are firmly secured to conductor body 10. While not shown in the figures, board assembly 26 is provided along its underside with a circuit (which may, for example, be a microwave printed circuit), having a terminal 32, one end of which lies immediately adjacent opening 31 to facilitate the provision of a solder connection between pin portion 15*d* and lead 32.

It can be seen from the foregoing description that the circuit provided on circuit board 18 (or at least a portion thereof) is now electrically connected to a circuit provided on circuit board 26 (or at least a portion thereof). Thus, electrical signals within such an assembly pass from a microstrip circuit through a coaxial circuit, back to a microstrip circuit. Due to this transition, it is very important that the interboard feed-through assembly provides good impedance matching between the two circuit boards. This impedance matching is provided for by the tapered sections 15*a* and 15*c* of pin 15. The tapers should be such that impedance matching between the microwave integrated circuits and the coaxial circuit will remain constant over a board operating frequency band, as well as providing an optimum match of the VSWR (voltage standing wave ratio) over the desired operating frequency range.

This technique is described in detail in copending application Ser. No. 709,264 filed Feb. 29, 1968 by applicant, and assigned to the assignee of the present invention. Thus, by controlling the angle of the taper and the length of the taper in accordance with the operational environments in which the interboard feed-through assembly is employed, good impedance matching is obtained between the microwave and coaxial circuits.

Whereas the above described embodiment has been set forth for circuits operating at microwave or RF frequencies, it should be understood that the interboard feed-through assembly of the present invention may also be utilized successfully in circuits which operate at lower frequencies. In such cases the necessity for the tapered sections 15*a* and 15*c* may thus be completely eliminated.

From a consideration of FIGS. 1*a* and 1*b*, it can be seen that the smaller diameter cylindrical portions 15*b* and 15*d* protrude beyond their respective associated ground planes 20 and 28 respectively, yielding a loss of symmetry in the region of the openings 21 and 31, respectively. By forming the openings 11—13 so as to extend the entire length of conductor body 10 and subsequently tapping each of these apertures near their upper and lower ends, exact alignment of the tapped portions of the aperture is assured. It will be noted especially from a consideration of FIG. 1*b* that the threaded fasteners (23—25, for example), together with terminal 22, are arranged at 90° intervals to provide circuit symmetry which replaces the loss of symmetry which would otherwise exist as a result of the removal of the ground plane in the region of opening 21 (and 31). In the absence of the precise alignment shown best in FIG. 2*a*, it has been found that moding will occur. However, as a result of the symmetrical arrangement, as shown in FIG. 1*b* for example, excellent mode suppression is provided with the interboard feed-through assembly.

In circuit applications designed to function at lower operating frequencies, it should be understood that the placing of the mounting hardware is not as critical, thereby yielding a greater latitude in placement of the tapped apertures, as well as placement of the openings provided in the circuit boards.

It can be seen from the foregoing description that the present invention provides a novel interboard feed-through assembly, preferably for use with integrated circuits, wherein circuits typically operating in the RF frequency range are mechanically and electrically connected to one another through the feed-through assembly, which assembly provides a coaxial circuit transition between the two microwave circuits. Although the preferred embodiment has been taught as being comprised of a solid conductive member, as shown best in FIGS. 2*a* and 2*b*, it should be understood that various modifications of this structure may be provided. As one example, the conductor body 10 may alternatively be a dielectric member having a conductive sleeve surrounding the exterior circumference of the body, which sleeve may be a solid metallic sleeve, or alternatively may be a conductive coating deposited or otherwise formed around the outer circumference of body 10, so as to make electrical contact with the ground planes 20 and 28. As another alternative, a conductive sleeve may be provided within or otherwise formed upon the interior surface of opening 14, so as to make electrical contact with ground planes 20 and 28. The dielectric sleeve 16 and pin 15 would then be mounted within the conductive sleeve arranged within the interior surface of opening 14, to form the coaxial circuit. The remaining design of body 10 would otherwise be similar to that shown in FIGS. 1*a*, 2*a* and 2*b*, for example, wherein suitable tapped openings may be provided for receiving the threaded fasteners, shown for example in FIG. 1*a*. Obviously, when the conductive sleeve is deposited around the exterior of a dielectric body 10, the need for dielectric sleeve 16 may be avoided. In cases where mode suppression is required, the conductive sleeves may be suitably electrically connected to the threaded fasteners by providing conductive coatings upon the top and bottom surfaces of body 10, so as to make electrical engagement with the threaded fasteners when the structure is fully assembled.

Although there has been described a preferred embodiment of this novel invention, many variations and modifications will now be apparent to those skilled in the art. Therefore, this invention is to be limited, not by the specific disclosure herein, but only by the appended claims.

The embodiments of the invention in which an exclusive privilege or property is claimed are defined as follows.

I claim:

1. A feed-through assembly for mechanically and electrically joining circuit boards of the microstrip type in closely spaced, parallel fashion comprising:

a cylindrical shaped body having top and bottom surfaces arranged substantially in spaced parallel fashion;

said body having a central opening and a plurality of mounting openings surrounding said central opening and lying at equispaced intervals therefrom;

said openings communicating with said top and bottom surfaces;

an elongated conductive pin positioned within said central opening; and an insulating sleeve surrounding said pin being positioned within said central opening;

said body and said pin forming a coaxial circuit;

the first and second ends of said pin extending beyond the top and bottom surfaces of said body;

said circuit boards each comprising a conductive ground plane on one surface spaced from a printed circuit provided on the opposite surface by an insulating layer and each being provided with openings to receive respective ends of said pin and each having at least one terminal lying adjacent its respective circuit board opening to facilitate electrical connections therebetween;

fastening means for each of said circuit boards being aligned with said mounting openings, each threadedly engaging an associated mounting opening to mechanically join each of said circuit boards to said body.

2. The assembly of claim 1, wherein said body is a solid conductive member.

3. The assembly of claim 1, wherein said body is a solid dielectric member having a conductive sleeve surrounding its outer cylindrical surface.

4. The assembly of claim 1, wherein said body is a solid dielectric member having a conductive sleeve mounted within said central opening and spaced from the conductive pin by said insulating sleeve.

5. The assembly of claim 1, wherein said conductive pin is an elongated member having an intermediate portion thereof being of cylindrical shape and having a first diameter;

said intermediate portion being joined at its opposite ends respectively by first and second tapered conical portions;

the ends of said tapered conical portions removed from said intermediate portion each being of a second diameter smaller than said first diameter;

the angle and length of said tapered conical portions being selected to provide good impedance matching between the circuits provided on said circuit boards and the coaxial circuit provided by the feed-through assembly.

6. The assembly of claim 5, wherein the tapered conical portions are each integrally joined to short cylindrical sections, each having a diameter substantially equal to said second diameter.

7. The assembly of claim 1, wherein the threaded fasteners joining each circuit board to the feed-through assembly are arranged at equal distances from their associated circuit board openings and, together with their associated terminals, are spaced at 90° intervals, to provide excellent mode suppression.

8. The assembly of claim 1, wherein each of said circuit boards are integrated circuits comprised of a thin planar insulating substrate having a conductive ground plane on one surface of the substrate, making surface contact with the respective top and bottom surfaces of said body, and having an integrated circuit formed upon the remaining surface of said substrate.

9. The assembly of claim 3, wherein each of said circuit boards are integrated circuits comprised of a thin planar insulating substrate having a conductive ground plane on one surface of the substrate making surface contact with the respective top and bottom surfaces of said body and having an integrated circuit formed upon the remaining surface of said substrate, said conductive sleeve being in electrical contact with both of said ground planes.

10. The assembly of claim 4, wherein each of said circuit boards are integrated circuits comprised of a thin planar insulating substrate having a conductive ground plane on one surface of the substrate making surface contact with the respective top and bottom surfaces of said body, and having an integrated circuit formed upon the remaining surface of said substrate, said conductive sleeve being in electrical contact with both of said ground planes.